United States Patent [19]

Howland

[11] Patent Number: 4,642,248

[45] Date of Patent: Feb. 10, 1987

[54] METHOD FOR COATING CYLINDRICAL MEMBERS

[76] Inventor: Howard Howland, 88 Clinton Pl., Hackensack, N.J. 07601

[21] Appl. No.: 745,888

[22] Filed: Jun. 18, 1985

[51] Int. Cl.$^4$ ............................ B05D 3/08; B05D 3/12
[52] U.S. Cl. .................................... 427/224; 427/346; 427/358
[58] Field of Search ..................... 427/407.1, 409, 410, 427/240, 386, 358, 224, 346

[56] References Cited

U.S. PATENT DOCUMENTS

| | | | |
|---|---|---|---|
| 4,007,680 | 2/1977 | Pfleger et al. ........................ | 101/153 |
| 4,508,767 | 4/1985 | Hokamura ........................ | 427/407.1 |

*Primary Examiner*—Thurman K. Page
*Attorney, Agent, or Firm*—Charles E. Baxley

[57] ABSTRACT

Disclosed herein are a method and apparatus for use in providing on the outer surface of an inner cylindrical member an epoxy coating of substantially uniform radial thickness. More particularly, the coated member is a roto-gravure printing cylinder.

The method comprises the steps of applying an innermost layer of an uncured mixture of an epoxy resin and a hardener to the outer surface of the member to a depth which is less than the desired coating thickness, applying at least one additional layer of the uncured mixture to the outer surface of an already applied layer, such that the total depth of all layers is at least as great as the thickness, heating the outermost layer after the application thereof to eliminate its porosity, and after the applying steps allowing the layers to cure to form the coating. The total depth of the layers is disclosed as greater than the thickness and the method includes, after curing, the further step of machining the outer surface of the cured epoxy to reduce the depth thereof to the desired radial thickness.

The apparatus comprises a holding device having an axis for gripping the member and rotating the same about its axis, a source of supply of the mixture, a mixture extruding tube connected to the supply and having extruding orifices parallel to the axis of the holding device for applying the mixture as aforesaid, and a ribbon burner parallel to the axis of the gripping means for directing a flame against the applied layers.

9 Claims, 3 Drawing Figures

METHOD FOR COATING CYLINDRICAL MEMBERS

BACKGROUND OF THE INVENTION

This invention relates to a method and apparatus for providing on the outer surface of an inner cylindrical member an epoxy coating of substantially uniform radial thickness and more particularly to a method and apparatus for use in producing a roto-gravure printing cylinder having an inner cylindrical member and an epoxy coating on the outer surface of the inner cylindrical member.

From Pfleger et al. U.S. Pat. No. 4,007,680, which issued Feb. 15, 1977, and of which the present applicant is one of two joint inventors, it is known to provide a roto-gravure printing cylinder having an inner cylindrical member of alumnium or steel or phenolic material and an epoxy coating on the outer surface of the inner cylindrical member. The Pfleger et al. patent discloses applying an uncured mixture of epoxy resin and hardener to the outer surface of the inner cylindrical member by reciprocating a brush longitudinally of the inner cylindrical member while the latter is rotated about its axis, thus to spread the uncured mixture to a desired radial thickness or depth as determined by forming members at opposite ends of the cylindrical member. When the level of the uncured mixture becomes flush with the peripheries of the forming members, application of the mixture is stopped and rotation of the coated member is continued for an additional four hours, or until the mixture sets or cures.

As is taught by the Pfleger et al. patent, the cured epoxy coating adheres very well to steel, aluminum and phenolic surfaces. The Pfleger et al. patent further teaches that the cured coating of the completed roto-gravure printing cylinder need not be provided with the required printing images by the use of acids, but can be easily engraved electronically to provide clearly defined printing images which will maintain good clarity of form through prolonged printing operations.

However, the manner of producing the printing cylinder disclosed in the Pfleger et al. patent is cumbersome and slow and is subject to inaccuracies in the thickness of the coating as well as being subject to deviations of the outer surface of the coatings from the required cylindrical shape. Further and most important, the surface of the coatings are subject to porosity.

An important object of the present invention is to provide an improved method and apparatus which overcomes the aforementioned disadvantages of the prior art, by providing a relatively rapid and sure method and apparatus for producing accurate, high quality non-porous roto-gravure printing cylinders or other cylindrical articles.

SUMMARY OF THE INVENTION

As stated, the invention relates to a method and apparatus for use in providing on the outer surface of an inner cylindrical member an epoxy coating of substantially uniform radial thickness, more particularly useful in producing a roto-gravure printing cylinder.

The method comprises the steps of applying an innermost layer of an uncured mixture of an epoxy resin and a hardener to the outer surface of the member to a depth which is less than the desired coating thickness, applying at least one additional layer of the uncured mixture to the outer surface of an already applied layer, such that the total depth of all layers is at least as great as the desired thickness, heating the outermost layer after the application thereof to eliminate its porosity, and after the applying steps allowing the layers to cure to form the coating. The total depth of the layers is advantageously greater than the thickness and the method includes, after curing, the further step of machining the outer surface of the cured epoxy to reduce the depth thereof to the desired radial thickness.

The apparatus comprises a holding device having an axis for gripping the member and rotating the same about its axis, a source of supply of the mixture, a mixture extruding tube connected to the supply and having extruding orifices parallel to the axis of the holding device for applying the mixture as aforesaid, and a ribbon burner parallel to the axis of the gripping means for directing a flame against the applied layers.

The invention, in both its method and apparatus aspects, is well adapted to achieve the objects and advantages set forth above and others.

DESCRIPTION OF THE INVENTION

Figure 1:
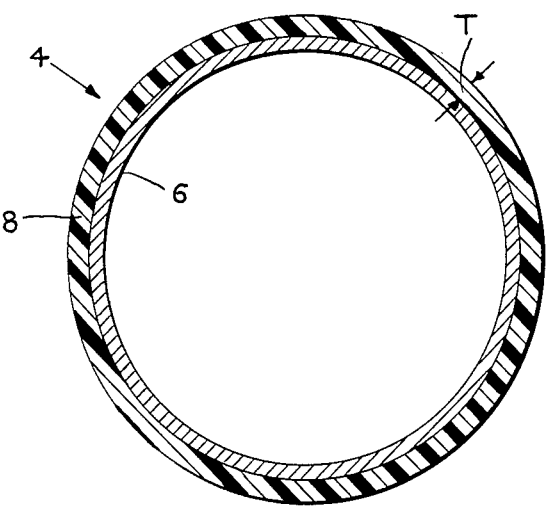
FIG. 1 is a transverse sectional view of a roto-gravure printing cylinder produced by the method and apparatus of the invention.

FIG. 1 shows in transverse section a roto-gravure printing cylinder 4 comprising an inner tubular cylindrical member 6 and an epoxy coating 8 of substantially uniform radial thickness "T" bonded to the outer surface of inner member 6.

As shown, inner member 6 is sectioned for metal, such as aluminum or steel. Alternatively, member 6 could be phenolic, as taught in the Pfelger et al. patent. As further taught in the Pfleger et al. patent, a suitable epoxy resin for this use is that known as "Epon No. 828" manufactured by Shell Chemical Company of Texas, and a suitable curing agent or hardener is that known as "Epon V-40" manufactured by General Mills Corporation. As stated, printing images can readily be engraved in the outer surface of coating 8, by an electronic engraving machine.

Figure 2:
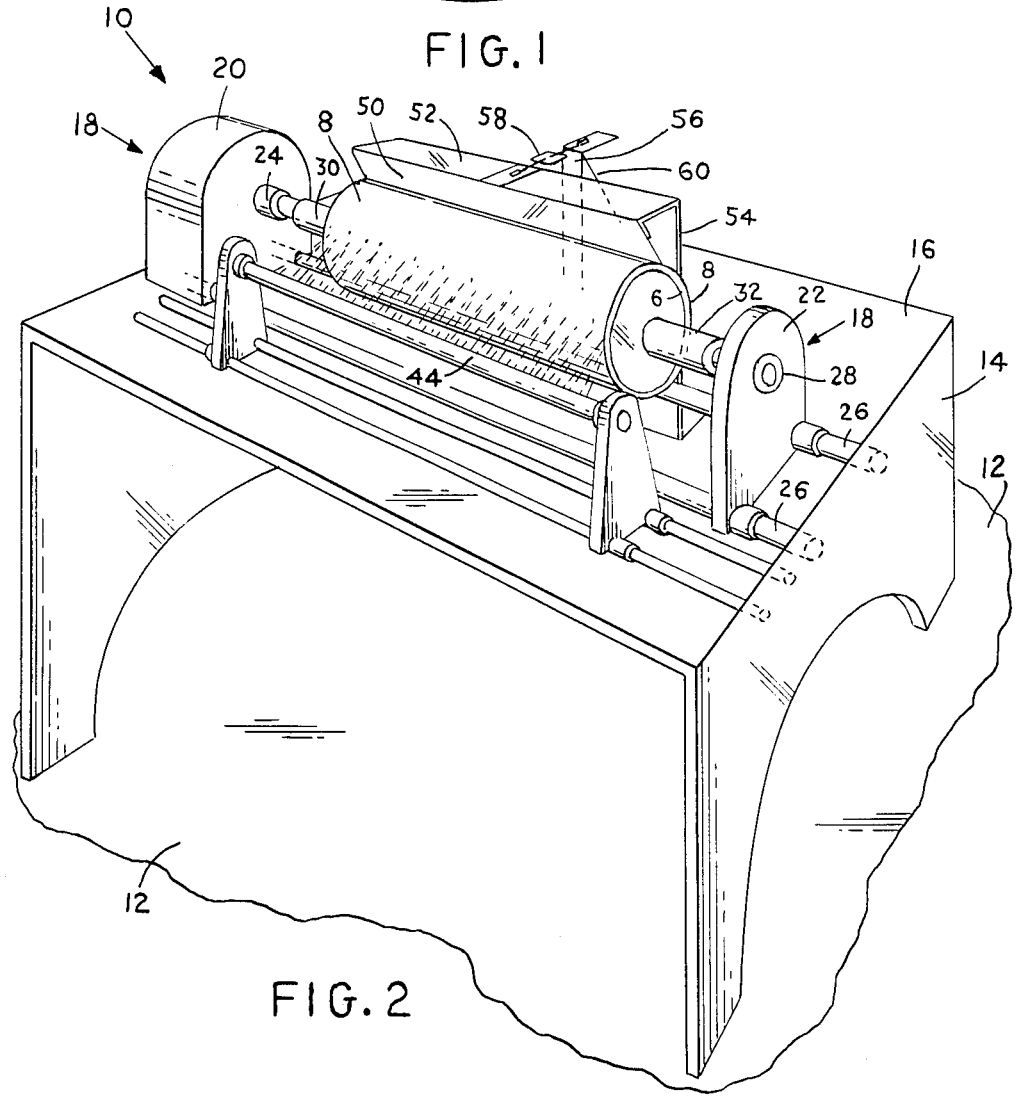
FIG. 2 is a somewhat schematic perspective view of apparatus according to the invention, with certain parts omitted for clarity.
Figure 3:
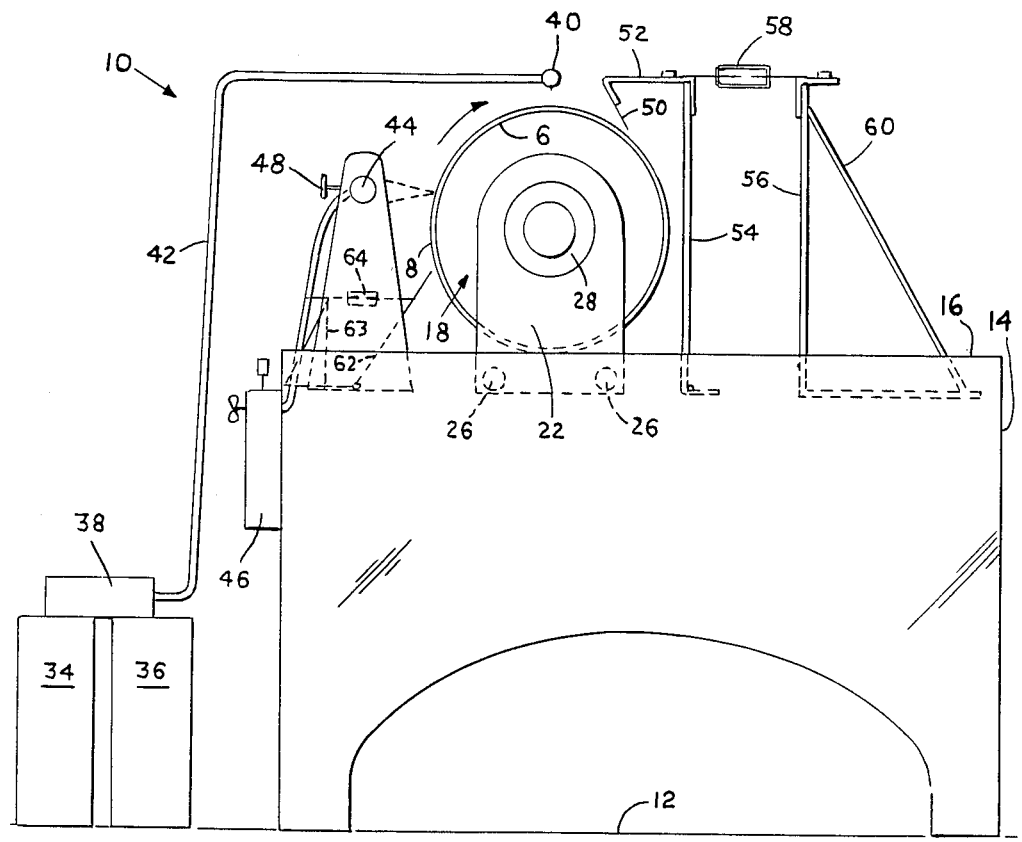
FIG. 3 is a somewhat schematic elevational view of the apparatus of FIG. 2, as seen from the righthand end thereof.

FIGS. 2 and 3 show apparatus, indicated generally at 10, for use in providing epoxy coating 8 of radial thichness "T" bonded to the outer surface of inner member 6.

Apparatus 10 is shown on a floor 12, part of apparatus 10 being mounted directly on floor 12 and the remainder being mounted on a table 14 which is mounted on floor 12. Table 14 has a horizontal top 16.

Apparatus 10 includes a holding device, indicated generally at 18 and carried on table top 16. Holding device 18 comprises spaced members 20 and 22 for releasably gripping the ends of inner cylindrical member 6. Member 20 is a variable speed electric motor mounted with its output shaft 24 horizontal. Member 22 is an end piece which is mounted on rails 26 which are parallel to output shaft 24. End piece 22 has a ball or roller bearing 28 which is aligned with shaft 24 and defines therewith an axis of holding device 18.

Member 6 may be provided at its ends with integral shaft members 31 and 32 for engaging output shaft 24 and bearing 28, respectively, whereby when motor 20 is turned on with member 6 gripped between output shaft 24 and bearing 28, member 6 will be rotated about its axis in the direction shown by the arrow in FIG. 3 with the axis of member 6 coincident with the axis of holding device 18.

Apparatus 10 further includes, mounted on floor 12, a supply 34 of epoxy resin and a supply 36 of a curing agent or hardener, a mixing device 38 for providing a supply of an uncured mixture of curing agent and hardener in varying proportions. A mixture extruding tube 20 (FIG. 3) is connected to the mixture supply by piping 42 and is parallel to the axis of holding device 18. Mixing device 28, upon the opening of a valve (not shown), forces uncured mixture of resin and hardener through piping 42 and thence into tube 40 and thence through extruding orifices therein vertically downwardly simultaneously onto substantially the entire length of the outer surface of member 6, to apply thereto an innermost layer of the uncured mixture, and later on at least one additional such layer to the outer surface of an already applied such layer, as described more particularly hereinafter. Means not shown are provided for selectively starting and stopping the flow of the mixture through tubing 42 and thence out of tube 40.

Apparatus 10 additionally includes a gas ribbon burner 44 parallel to the axis of holding device 18 for directing a flame against each layer of the uncured mixture after it has been applied, as member 6 is rotated about its axis. Ribbon burner 44 extends substantially from end to end of member 6. A gas control panel 46 regulates the flow of gas to burner 44 and a valve has a handle 48 for turning burner 44 on and off.

Apparatus 10 also includes a layer doctor blade 50 parallel to the axis of holding device 18 for determining the depth of the applied layers of the uncured mixture. Layer doctor blade 50 is of adjustable distance from the axis of holding device 18. More particularly, layer doctor blade 50 is mounted on a bracket 52 secured to the upper end of an elastically bendable member 54 upstanding from table top 16.

Laterally spaced from member 54 and further from the axis of holding device 18 than member 54 is another member 56 upstanding from table top 16. A turnbuckle 58 is connected between the upper ends of members 54 and 56 and a brace 60 is connected at its lower end to table top 16 and at its upper end to member 56 at a location near its upper end. Thus, member 56 is held stationary, and by means of turnbuckle 58 the distance between the upper ends of members 54 and 56 can be changed, thus to adjust the distance between layer doctor blade 50 and the axis of holding device 18.

As seen in FIG. 3, apparatus 10 further includes a leveling doctor blade 62 parallel to the axis of holding device 18 for truing up the outer surface of each applied layer of uncured mixture. Leveling doctor blade 62 is, like layer doctor blade 50, adjustable by means of turnbuckle 64, relative to holding device 18.

As shown in FIG. 3, as member 6 is rotated about its axis, any point on the circumference thereof passes, in order, tube 40, layer doctor blade 50, leveling doctor blade 62 and burner 44 before again passing tube 40.

Mixing device 38 may be a Glas-craft Ratio-Master, which, by turning a knob (not shown) can be adjusted to furnish a ratio of Epon resin 828 to Epon V-40 curing agent or hardener anywhere in the range from 1:1 to 4:1. A ratio of 2:1 gives satisfactory results in the present context.

After the aforesaid ratio is adjusted, and with member 6 in place in apparatus 10 as described above, motor 20 is turned on at very low speed, about one revolution every 4 seconds. While member 6 is thus rotating slowly, burner 40 is turned on to preheat member 6 to dry out moisture from its metal surface. After about 20 seconds (5 revolutions), burner 40 is shut off.

Then, layer doctor blade 50 and leveling doctor blade 62 are adjusted to positions, each about 0.002 inch (0.00508 cm.) from the outer surface of member 6 to provide a base layer on the metal.

While member 6 continues to be rotated at a low speed, the valve of mixing device 38 is opened and the uncured mixture is applied from tube 40 onto the outer surface of member 6 simultaneously from end to end thereof and ahead of layer doctor blade 50, to apply an innermost layer of uncured mixture to the outer surface of member 6, in about seven revolutions of member 6 (about 30 seconds). At this point the valve of mixing device 38 is shut to stop the feed of the mixture.

While member 6 continues to rotate, layer doctor blade 50 and leveling doctor blade 62 are moved back 0.010 inch (0.00254 cm.) from the outer surface of member 6, and burner 44 is turned on. The flame is adjusted so that the tip of the flame touches the outer surface of the innermost uncured layer and the flame is so applied for 2 or 3 revolutions of member 6 and then is shut off. This heating eliminates layer porosity and trues up the outer surface of the layer.

Member 6 is then rotated at low speed for about 8 to 10 revolutions, to permit the surface of the just applied layer to cool down.

The speed of rotation of member 6 is then adjusted, if necessary, to a speed of rotation of 7 revolutions in about 30 seconds.

The valve of mixing device 38 is again opened, and an additional layer of the uncured mixture is applied to the innermost layer, in the manner previously described for the innermost layer, so that the total depth of the innermost layer and the additional layer is 0.012 inch (0.03048 cm.).

Burner 44 is again turned on and the flow is adjusted so that its tip touches the outer surface of the additional uncured layer, as before to eliminate porosity and true up the outer surface of the first applied layer. As before, the flame is applied for 2 or 3 revolutions and then shut off.

If it be assumed that the thickness T of coating 8 of finished roto-gravure printing cylinder 4 is to be 0.012 inch (0.03048 cm), a further layer is preferably applied to the additional layer, the depth of the further layer being, as before, 0.010 inch (0.0254 cm.), to provide a total layer depth of 0.022 inch (0.05588 cm.). The application of the further additional layer is preceded by moving doctor blades 50 and 62 another 0.010 inch (0.0254 cm.) from the outer surface of member 6 and is followed by flame application to the outer surface of the further layer.

The curing of the applied uncured mixture may be accompished in known fashion, after which the outer surface of the cured coating may be machined to reduce the depth thereof to the desired final thickness "T" of coating 8, thus to complete the production of roto-gravure printing cylinder 4.

Despite having been formed by a plurality of layers, coating 8 is homogeneous and non-porous.

The radial depth of each layer is substantially uniform and the radial depths of the layers are substantially equal. Typically these layers range from 0.010 inch (0.0254 cm.) to 0.050 inch (0.1270 cm.).

The invention admirably attains the objects and advantages set forth above and others.

The disclosed details are exemplary only and are not to be taken as limitations on the invention except as those details may be included in the appended claims.

What is claimed is:

1. A method for providing on the outer surface of an inner cylindrical member an epoxy coating of substantially uniform final radial thickness, said method comprising the steps of applying an innermost layer of an uncured mixture of an epoxy resin and a hardener to the outer surface of said member to a depth which is less than said thickness while rotating said member about its axis, applying at least one additional layer of said uncured mixture to the outer surface of an already applied said layer while rotating said member about its axis, such that the total depth of said layers is at least as great as said thickness, heating the outermost said layer after each applying step to eliminate its porosity while rotating said member about its axis, utilizing a layer doctor blade parallel to the axis of depth of each said layer, and utilizing a leveling doctor blade parallel to the axis of said member and of adjustable distance therefrom to true up the outer surface of each said layer, and after the applying steps allowing said layers to cure.

2. The method of claim 1 wherein the total depth of said layers is greater than said thickness and the method includes, after curing, the further step of machining the outer surface of said cured epoxy to reduce the depth thereof to said thickness.

3. The method of claim 1 wherein at least two said additional layers are applied and the total depth of all said layers is greater than said thickness and the method includes, after curing, the further step of machining the outer surface of said cured epoxy to reduce the depth thereof to said thickness.

4. The method of claim 1 wherein said applying steps are performed with the aid of an extruding tube parallel to the axis of the member and said mixture is forced from orifices in said tube and onto said member or an already applied said layer.

5. The method of claim 4 wherein said heating steps are performed with the aid of a ribbon burner parallel to the axis of the member, and flame from said burner is directed against the outer surface of each said layer after each said applying step.

6. A method for producing a roto-gravure printing cylinder including an inner cylindrical member and an epoxy coating of substantially uniform final radial thickness on the outer surface of said cylindrical member, said method comprising the steps of applying an innermost layer of an uncured mixture of an epoxy resin and a hardener to the outer surface of said member to a depth which is less than said thickness while rotating said member about its axis, applying at least one additional layer of said uncured mixture to the outer surface of an already applied said layer while rotating said member about its axis, such that the total depth of said layers is at least as great as said thickness, heating the outermost said layer after each said applying step to eliminate its porosity while rotating said member about its axis, utilizing a layer doctor blade parallel to the axis of said member and of adjustable distance therefrom to determine the depth of each said layer, and utilizing a leveling doctor blade parallel to said axis and of adjustable distance therefrom to true up the outer surface of each said layer, and thereafter allowing said layers to cure to form said coating.

7. The method of claim 6 wherein the total depth of said layers is greater than said thickness and the method includes, after curing, the further step of machining the outer surface of said cured epoxy to reduce the depth thereof to said thickness.

8. The method of claim 6 including the further steps of adjusting the positions of said doctor blades prior to each applying step.

9. The method of claim 8 wherein the final thickness is about 0.012 inch (0.03048 cm), the depth of the innermost layer is about 0.002 inch (0.00508 cm), as determined by said layer doctor blade and trued up by said leveling doctor blade, the depth of a first additional layer is about 0.010 inch (0.0254 cm), as determined by said layer doctor blade and trued up by said leveling doctor blade, and the depth of a second additional layer is about 0.010 inch (0.0254 cm), as determined by said layer doctor blade and trued up by said leveling doctor blade, thus to obtain a total layer depth of about 0.022 inch (0.05588 cm), and in said machining step about 0.012 inch (0.03048 cm) is removed from the outer surface of the cured epoxy.

* * * * *